(12) United States Patent
Benisch et al.

(10) Patent No.: US 11,125,587 B2
(45) Date of Patent: Sep. 21, 2021

(54) MEASUREMENT SYSTEM AND METHOD FOR OPERATING A MEASUREMENT SYSTEM

(71) Applicant: Rohde & Schwarz GmbH & Co. KG, Munich (DE)

(72) Inventors: Christian Benisch, Munich (DE); Werner Perndl, Munich (DE); Markus Gallhauser, Munich (DE); Nino Voss, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 65 days.

(21) Appl. No.: 16/276,091

(22) Filed: Feb. 14, 2019

(65) Prior Publication Data

US 2019/0285440 A1    Sep. 19, 2019

(30) Foreign Application Priority Data

Mar. 13, 2018  (EP) .................... 18161600

(51) Int. Cl.
*G01R 1/067*   (2006.01)
*G01D 7/00*    (2006.01)
*G08C 17/02*   (2006.01)
*H01Q 13/08*   (2006.01)
*G01R 1/02*    (2006.01)

(52) U.S. Cl.
CPC ........... *G01D 7/00* (2013.01); *G01R 1/06788* (2013.01); *G08C 17/02* (2013.01); *G01R 1/025* (2013.01); *G08C 2201/30* (2013.01); *H01Q 13/085* (2013.01)

(58) Field of Classification Search
CPC ...... G01D 7/00; G08C 17/02; G08C 2201/30; G01R 1/06788; G01R 1/025; H01Q 13/085
USPC ............. 73/866.1, 570–648, 861.05, 861.06, 73/861.95, 861.18–861.31, 73/861.42–861.64, 290 B, 290 V, 866.5
See application file for complete search history.

(56) References Cited

U.S. PATENT DOCUMENTS

| | | | |
|---|---|---|---|
| 2004/0160410 A1 | 8/2004 | Plathe | |
| 2004/0222884 A1* | 11/2004 | Costa | ................. G08B 17/10 340/522 |
| 2004/0239308 A1 | 12/2004 | Fazzina | |
| 2004/0239309 A1 | 12/2004 | Barr et al. | |

(Continued)

FOREIGN PATENT DOCUMENTS

CN    203705546   *  7/2014
EP    3232205 A1    10/2017

*Primary Examiner* — Robert R Raevis
(74) *Attorney, Agent, or Firm* — Christensen O'Connor Johnson Kindness PLLC

(57) ABSTRACT

A measurement system comprising a measurement device and at least a first probe unit and a second probe unit is disclosed. The first probe unit and the second probe unit are each connected to the measurement device in a signal transmitting manner. At least one of the measurement device and the first probe unit comprises a control unit. The first probe unit comprises an interface module being configured to generate an input data signal and to provide the input data signal to the control unit. The control unit is configured to generate and provide a control signal at least to the second probe unit based on the input data signal. Moreover, a method for operating a measurement system is disclosed.

13 Claims, 2 Drawing Sheets

(56) References Cited

U.S. PATENT DOCUMENTS

| | | | |
|---|---|---|---|
| 2005/0194978 A1* | 9/2005 | Smith | G01R 31/11 324/527 |
| 2005/0200346 A1 | 9/2005 | Novak et al. | |
| 2013/0106401 A1 | 5/2013 | Johnson et al. | |

* cited by examiner

MEASUREMENT SYSTEM AND METHOD FOR OPERATING A MEASUREMENT SYSTEM

FIELD OF THE DISCLOSURE

The present disclosure concerns a measurement system as well as a method for operating a measurement system.

BACKGROUND

For certain measurements, several measurement probes may be connected to a main measurement device, wherein the probes may be located at a certain distance from the main measurement device.

In prior art measurement systems, operational parameters of the measurement system are adjusted via a graphical user interface at the main measurement device. Therefore, the operator or rather the user of the measurement system always has to operate the main measurement device for adjusting the operational parameters. Thus, it is not possible for the user to adjust the operational parameters of the measurement system when he is not near to the main measurement device. This can cause various difficulties when configuring the probes, in particular a functional interaction between the probes. Particularly, the installation and setup of the measurement system may be time-consuming.

Therefore, an object is to provide a measurement system as well as a method for operating a measurement system which improve the disadvantages of the state of the art.

SUMMARY

According to the present disclosure, the problem is solved, for example, by a measurement system comprising, for example, a measurement device and at least a first probe unit and a second probe unit. The first probe unit and the second probe unit each are connected to the measurement device in a signal transmitting manner. At least one of the measurement device and the first probe unit comprises a control unit, such as a controller or other computing device. The first probe unit comprises an interface module being configured to generate an input data signal and to provide the input data signal to the control unit. The control unit is configured to generate and provide a control signal at least to the second probe unit based on the input data signal.

Accordingly, a user input received via the first probe unit is processed to provide a control signal to at least the second probe unit. Therefore, a user may control the second probe unit (which is possible located a certain distance away from the first probe) without having to walk to the second probe or to the measurements device. This way, configuring the probe units, for example a functional interaction between the probe units, is greatly simplified for the user. Of course, the first probe unit may also be controlled via the interface module, such that a user can control the first probe unit and the second probe unit while standing at the first probe unit.

Moreover, the second probe unit may also comprise an interface module being configured similar to the interface module of the first probe unit, such that a user may control all probe units while standing at either one of them.

Generally, the probe units are formed separately from each other. Hence, the measurement system comprises at least two separately formed probe units.

In addition, the measurement device may be established separately with respect to the probe units so that the measurement system comprises at least two separately formed probe units as well as one separately formed measurement device.

The first probe unit may be configured to perform analog or digital signal processing. The measurement device may be an oscilloscope, a logic analyzer and/or any other measurement device suitable for a particular measurement at hand. Moreover, the probe units may be connected to the measurement device tethered by wire or wirelessly.

According to one aspect, the control unit is configured to provide the control signal to the second probe unit and the measurement device. This way, the user may control both the second probe unit and the measurement device while standing at the first probe unit without leaving the first probe unit.

According to another aspect, the measurement device is configured to forward the control signal generated by the first probe unit comprising the control unit. In other words, the measurement device serves as a central router forwarding the control signal to the probe units. There may be additional probe units connected to the measurement device, and the measurement device may be configured to forward the control signals only to the proper probe units to be controlled.

In one embodiment of the present disclosure, at least the second probe unit is configured to adjust an operational parameter based on the control signal. The operational parameters may comprise one or more selected from the group of: an operational status (e.g. "on" or "off"), a measurement activity status, a frequency to be measured and a bandwidth of a frequency band to be measured. If the control signal is also provided to the first probe unit and/or the measurement device, the first probe unit and/or the measurement device may also be configured to adjust an operational parameter. Accordingly, the operational parameter may relate to a measurement parameter, namely a parameter to be measured.

The interface module may be configured to forward the input data signal to the measurement device. The measurement device may store the input data signal and/or visualize the input data signal via a graphical user interface.

In a further aspect, at least one of the first and the second probe units comprises a detector unit being configured to at least one of detect and transmit electromagnetic signals. In some embodiments, the detector unit is configured to detect and/or transmit electromagnetic signals such as radio frequency (RF) signals. For example, the detector unit may comprise an antenna, for example a tapered slot (Vivaldi) antenna.

In another embodiment of the present disclosure, the detector unit comprises a first and a second interface, the first interface being configured to receive electromagnetic waves and to provide a measurement signal to the second interface. The first interface may be an interface for receiving radio frequency signals.

According to a further aspect, the second interface is configured to generate a processed measurement signal based on the measurement signal. In other words, the second interface converts the measurement signal provided by the first interface to a signal suitable for the measurement device. Accordingly, the second interface may be configured to generate an analog processed measurement signal and/or a digital processed measurement signal, depending on the kind of signal the measurement device is configured to process.

In another aspect, a frequency of the processed measurement signal is lower than a frequency of the received electromagnetic waves. Put another way, the processed measurement signal is down-converted from the measurement signal provided by the first interface.

The control signal may also be forwarded to the first probe unit. Thus, both probe units may be controlled by the user while standing at the first probe unit.

In some embodiments of the present disclosure, the control signal comprises at least one control command selected from the group of: switch on at least one of the first probe unit, the second probe unit and the measurement device; switch off at least one of the first probe unit, the second probe unit and the measurement device; transmit data to at least one of the first probe unit, the second probe unit and the measurement device; and adjust a trigger condition.

According to one aspect, the first probe unit comprises a monitoring unit being connected to the measurement device in a signal transmitting manner. Via the monitoring unit, operational parameters of the measurement system may be indicated to the user. The monitoring unit may indicate the operational parameters graphically, e.g. via a display, or by means of one or more status lights. Alternatively or additionally, the operational parameters may also be indicated acoustically, e.g. with predefined acoustic patterns, via a speaker or other transducer.

According to another aspect, the monitoring unit is configured to indicate a status of at least one of the probe units. Thus, the user is informed about the status (e.g. "on" or "off") of the probe units without walking to the measurement device or other probe units.

In another embodiment of the present disclosure, the monitoring unit is configured to indicate a representation of the control signal. For example, the monitoring unit displays a representation of possible control commands, for example in the form of a list or a drop-down menu. This way, configuring the probe units and/or the measurement device is facilitated.

According to one embodiment, the measurement system, for example the control unit, is configured to provide the control signal to the second probe unit and the measurement device.

According to another embodiment, the measurement system, for example the control unit, is configured to provide the control signal only to the second probe unit.

An embodiment provides that the measurement device may comprise the control unit so that the measurement device receives the input data signal generated by the first probe unit, for example its interface module. Then, the control unit of the measurement device generates and provides the respective control signal.

Another embodiment provides that the first probe unit itself comprises the control unit so that the input data signal provided by the interface module is forwarded internally (within the first probe unit) to the integrated control unit that is configured to generate and provide the respective control signal.

The functionality of the control unit and/or other components of the measurement system may be carried out via hardware implementations or software implementations, or a combination of hardware and software implementations. These implementations can be carried out suitably either digitally or in analog or both, depending on an intended application.

According to the present disclosure the problem is also solved by a method for operating a measurement system, for example a measurement system as described above, wherein the measurement system comprises a measurement device and at least a first probe unit and a second probe unit. The method comprises the following steps:

receiving a user input via the first probe unit;
generating an input data signal based on the user input;
generating a control signal based on the input data signal; and
adjusting at least one operational parameter of the second probe unit based on the control signal.

Of course, also operational parameters of the first probe unit and/or the measurement device may be adjusted. With regards to the advantages, reference is made to the explanations given above.

As mentioned above, the control signal is generated by the control unit which may be integrated in the measurement device and/or the first probe unit so that the control signal may be generated by the measurement device and/or the first probe unit.

Moreover, the second probe unit or in some embodiments the second probe unit and the measurement device may be set appropriately by the control signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
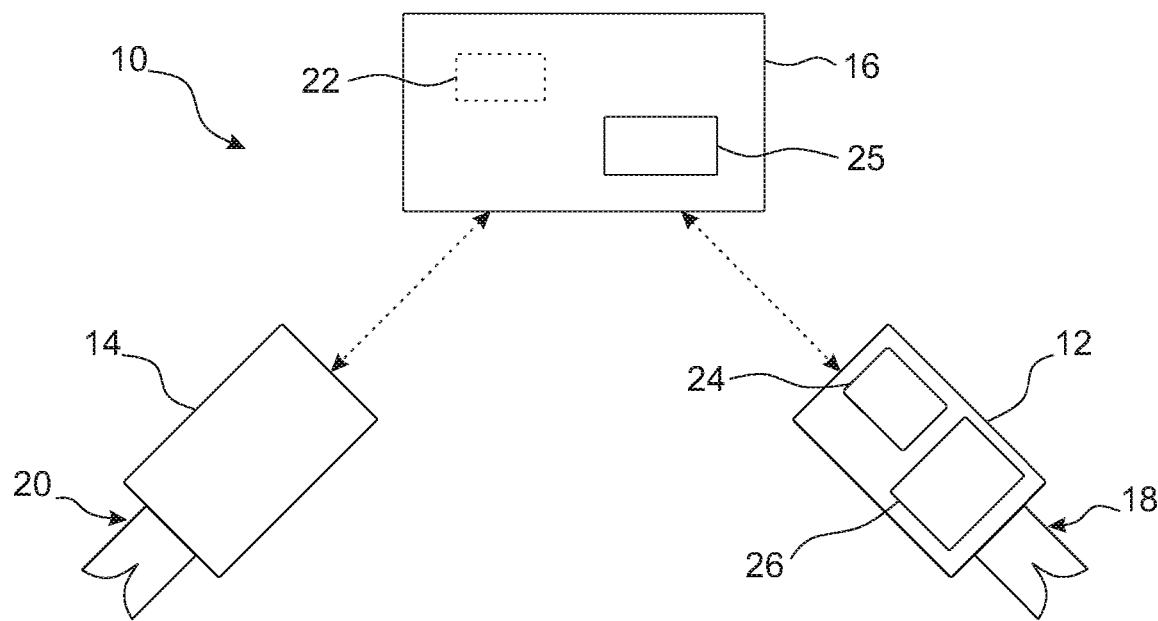
FIG. 1 shows a measurement system according to a first embodiment of a measurement system according to the present disclosure.

FIG. 1 shows a measurement system 10 comprising a first probe unit 12, a second probe unit 14 and a measurement device 16 which are separately formed from each other. The measurement system 10 may also comprise additional probe units. The measurement device 16 may be an oscilloscope, a logic analyzer and/or any other measurement device suitable for a particular measurement at hand.

The first probe unit 12 and the second probe unit 14 are connected to the measurement device 16 in a signal transmitting manner (indicated by the dashed arrows in FIGS. 1 and 2), which may be tethered by wire or wirelessly.

The first probe unit 12 and the second probe unit 14 unit can each be configured to perform any kind of measurements. In the example shown in FIGS. 1 and 2, the first probe unit 12 and the second probe unit 14 comprise detectors, such as detector units 18, 20, that are each configured to detect and/or transmit electromagnetic signals, for example radio frequency signals. In some embodiments, the detector units 18, 20 are configured as antennas, such as for example tapered slot (Vivaldi) antennas.

At least one of the detector units 18, 20 may comprise a first interface and a second interface, wherein the first interface is configured to receive electromagnetic waves and to provide a measurement signal to the second interface. The second interface is configured to process the measurement signal provided by the first interface. The second interface provides a processed measurement signal based on the measurement signal forwarded by the first interface, wherein the processed measurement signal may be an analog or a digital signal.

In other words, the second interface converts the measurement signal provided by the first interface to a signal suitable for the measurement device 16. Accordingly, the second interface may be configured to generate an analog processed measurement signal and/or a digital processed measurement signal, depending on the kind of signal the measurement device 16 is configured to process.

In some embodiments, processing the measurement signal can include, for example, the following: amplifying; digitizing; multiplexing; condensing; compressing; filtering; scaling; averaging; signal conditioning; buffering, etc., and/or combinations thereof.

In some embodiments, the processed measurement signal may be down-converted from the measurement signal, e.g., a frequency of the processed measurement signal may be lower than a frequency of the received electromagnetic waves.

The processed measurement signal can then be forwarded to the measurement device 16, for example by the second interface.

Figure 2:
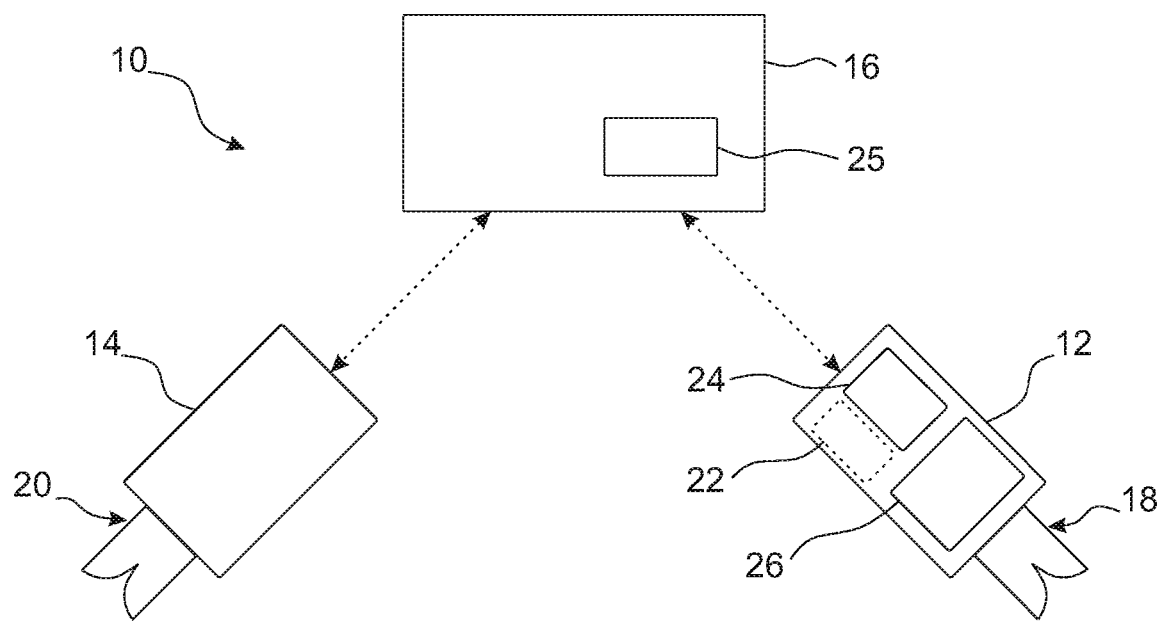
FIG. 2 shows a measurement system according to another embodiment of a measurement system according to the present disclosure.

In the embodiment shown in FIG. 1, the measurement device 16 comprises a control unit 22, while in the embodiment shown in FIG. 2 the first probe unit 12 comprises the control unit 22.

An interface module 24 is provided at the first probe unit 12. Via the interface module 24, a user may input data and/or commands. The interface module 24 is configured to generate an input data signal based on the data and/or commands input by the user. Of course, a second interface module may be provided at the second probe unit 14, which may be configured in a similar manner as the interface module 24.

Figure 3:
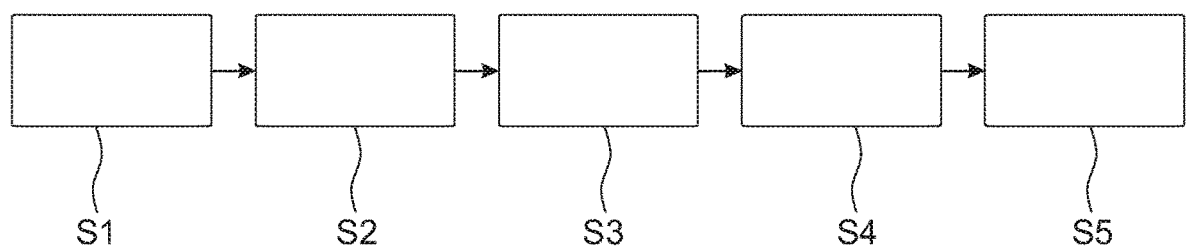
FIG. 3 shows a schematic flow chart of a method for operating a measurement system according to the present disclosure.

A method for operating the measurement system 10 is described below with reference to FIG. 3. Generally, the method may be applied to both embodiments shown in FIG. 1 and FIG. 2.

First, a user input is received via the first probe unit 12 (step S1), more precisely via the interface module 24.

Based on the user input, the input data signal is generated via the interface module 24 (step S2) and forwarded to the control unit 22.

In the embodiment shown in FIG. 1, the input data signal is forwarded to the measurement device 16 by the interface module 24. The measurement device 16 may store the input data signal and/or visualize the input data signal via a graphical user interface 25 presented by a display. In some embodiments, the measurement device 16 includes or is associated with one or more input devices, such as switches, buttons, keyboard, key pad, track ball, mouse, touchscreen, etc., for interacting with the graphical user interface 25.

In the embodiment shown in FIG. 2, the input data signal is processed internally since the control unit 22 is integrated in the first probe unit 12.

Irrespective of the integration of the control unit 22, the control unit 22 generates a control signal based on the input data signal (step S3). The control signal may comprise at least one control command selected from the group of: switch on at least one of the first probe unit 12, the second probe unit 14 and the measurement device 16; switch off at least one of the first probe unit 12, the second probe unit 14 and the measurement device 16; transmit data to at least one of the first probe unit 12, the second probe unit 14 and the measurement device 16; and adjust a trigger condition.

The control signal is then forwarded at least to the second probe unit 14 (step S4). Additionally, the control signal may also be forwarded to the measurement device 16 and the first probe unit 12 as shown in the embodiment of FIG. 2 since the control unit 22 is integrated in the first probe unit 12.

In some embodiments, when the control unit 22 is comprised in the first probe unit 12, the measurement device 16 may just forward the control signal to the second probe unit 14. Hence, the first probe unit 12 only controls the second probe unit 14.

As indicated above, the control signal may also control the second probe unit 14 and the measurement device 16.

Based on the control signal, at least one operational parameter of the second probe unit 14 and/or the first probe unit 12 and/or the measurement device 16 is adjusted (step S5).

To summarize, at least one operational parameter of the measurement system 10, more specifically an operational parameter of the second probe unit 14, the first probe unit 12 and/or the measurement device 16, is adjusted based on an input issued by an user at the first probe unit 12 (or at any other probe unit).

The operational parameters may comprise one or more selected from the group of: an operational status (e.g. "on" or "off"), a measurement activity status, and a measurement parameter such as a frequency to be measured and a bandwidth of a frequency band to be measured.

The first probe unit 12 may comprise a monitoring unit 26 that is connected to the measurement device 16 and/or the second probe unit 14 in a signal transmitting manner (e.g. wired or wireless). The monitoring unit 26 may indicate a status and/or other operational parameters of at least one of the probe units 12, 14. The monitoring unit 26 may also indicate the status and/or other operational parameters of the measurement device 16.

In some embodiments, the monitoring unit 26 indicates the status and/or other operational parameters graphically, e.g. via a display, or by way of one or more status lights. Alternatively or additionally, the status and/or operational parameters may also be indicated acoustically, e.g., with predefined acoustic patterns via a speaker or other transducer.

In some embodiments, the monitoring unit 26 may be also configured to indicate a representation of the control signal, for example graphically, by way of one or more status lights and/or acoustically as described above.

The control unit 22 may include, in some embodiments, logic for implementing the technologies and methodologies described herein. This logic of the control unit 22 can be carried out in either hardware or software, or a combination of hardware and software. In an example, the functionality of the control unit 22 could be implemented by special purpose hardware-based computer systems or circuits, etc., or combinations of special purpose hardware and computer instructions. In some embodiments, the control unit 22 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit 22 includes a microprocessor and a memory storing logic modules and/or instructions. In an embodiment, the control unit 22 includes one or more ASICs having a plurality of predefined logic components. In an embodiment, the control unit 22 includes one or more FPGA having a plurality of programmable logic components. In an embodiment, the control unit 22 includes combinations of circuits and computer program products having software or firmware instructions stored on one or more computer readable memories that work together to cause a device to perform one or more methodologies or technologies described herein. In an embodiment, the control unit 22 includes hardware circuits (e.g., implementations in analog circuitry, implementations in digital circuitry, and the like, and combinations thereof) for carrying out the functionality described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiment of the invention in which an exclusive property or privilege is claimed are defined as follows:

1. A measurement system comprising:
   a measurement device; and
   at least a first probe unit and a second probe unit,
   the first probe unit and the second probe unit each being connected to the measurement device in a signal transmitting manner,
   at least one of the measurement device or the first probe unit comprising a control circuit,
   the first probe unit comprising an interface configured to generate an input data signal and to provide the input data signal to the control circuit,
   wherein the control circuit is configured to generate and to provide a control signal at least to the second probe unit based on the input data signal,
   wherein at least the second probe unit is configured to adjust an operational parameter based on the control signal,
   wherein the operational parameter relates to a measurement parameter to be measured,
   wherein the first probe unit includes the control circuit, and wherein the control circuit is configured to provide the control signal to the second probe unit and the measurement device.

2. The measurement system according to claim 1, wherein the measurement device is configured to forward the control signal generated by the first probe unit when the first probe unit comprises the control circuit.

3. The measurement system according to claim 1, wherein the interface is configured to forward the input data signal to the measurement device.

4. The measurement system according to claim 1, wherein at least one of the first or the second probe units comprises a detector unit being configured to detect or transmit electromagnetic signals.

5. The measurement system according to claim 4, wherein the detector unit comprises a first interface and a second interface, the first interface of the detector unit being configured to receive electromagnetic waves and to provide a measurement signal to the second interface of the detector unit.

6. The measurement system according to claim 5, wherein the second interface of the detector unit is configured to generate a processed measurement signal based on the measurement signal.

7. The measurement system according to claim 6, wherein a frequency of the processed measurement signal is lower than a frequency of the received electromagnetic waves.

8. The measurement system according to claim 1, wherein the control signal is also forwarded to the first probe unit.

9. The measurement system according to claim 1, wherein the control signal comprises at least one control command selected from the group consisting of: switch on at least one of the first probe unit, the second probe unit and the measurement device; switch off at least one of the first probe unit, the second probe unit and the measurement device; transmit data to at least one of the first probe unit, the second probe unit and the measurement device; and adjust a trigger condition.

10. The measurement system according to claim 1, wherein the first probe unit comprises a monitoring unit connected to the measurement device in a signal transmitting manner.

11. The measurement system according to claim 10, wherein the monitoring unit is configured to indicate a status of at least one of the probe units.

12. The measurement system according to claim 10, wherein the monitoring unit is configured to indicate a representation of the control signal.

13. A measurement system comprising:
    a measurement device; and
    at least a first probe unit and a second probe unit,
    the first probe unit and the second probe unit each being connected to the measurement device in a signal transmitting manner,
    the first probe unit comprising a control circuit and an interface, the interface configured to generate an input data signal and to provide the input data signal to the control circuit,
    wherein the control circuit is configured to generate and to provide a control signal at least to the second probe unit based on the input data signal, and wherein the control circuit is configured to provide the control signal to the measurement device.

* * * * *